(12) United States Patent
Jia et al.

(10) Patent No.: US 9,182,444 B2
(45) Date of Patent: Nov. 10, 2015

(54) SYSTEM AND METHODS FOR MEMORY INSTALLATION IN FUNCTIONAL TEST FIXTURE

(71) Applicants: Hui Peng Jia, Shanghai (CN);
Chungfeng Yang, Shanghai (CN); Bin Li, Shenzhen (CN)

(72) Inventors: Hui Peng Jia, Shanghai (CN);
Chungfeng Yang, Shanghai (CN); Bin Li, Shenzhen (CN)

(73) Assignee: Dell Products, L.P., Round Rock, TX (US)

( * ) Notice: Subject to any disclaimer, the term of this patent is extended or adjusted under 35 U.S.C. 154(b) by 268 days.

(21) Appl. No.: 13/710,376

(22) Filed: Dec. 10, 2012

(65) Prior Publication Data

US 2014/0159757 A1    Jun. 12, 2014

(51) Int. Cl.
*G01R 31/28* (2006.01)
*G11C 29/56* (2006.01)
*G01R 1/04* (2006.01)

(52) U.S. Cl.
CPC ...... *G01R 31/2808* (2013.01); *G11C 29/56016* (2013.01); *G01R 1/0408* (2013.01)

(58) Field of Classification Search
CPC ............... G01R 31/28; G01R 31/2808; G01R 31/2806; G01R 1/04; G01R 31/02; G01R 31/046; G01M 5/005; G06F 19/00; G06F 17/50
USPC ............... 324/755, 758, 765, 750.25, 754.08, 324/763.01
See application file for complete search history.

(56) References Cited

U.S. PATENT DOCUMENTS

| | | | |
|---|---|---|---|
| 5,046,237 A * | 9/1991 | Conforti et al. | 29/764 |
| 5,265,328 A * | 11/1993 | Gorman | 29/829 |
| 6,218,852 B1 * | 4/2001 | Smith et al. | 324/757.02 |
| 2002/0053809 A1 * | 5/2002 | Paek et al. | 294/88 |
| 2003/0006792 A1 * | 1/2003 | Adams et al. | 324/755 |
| 2004/0178815 A1 * | 9/2004 | Ou et al. | 324/755 |
| 2012/0007625 A1 * | 1/2012 | Kim et al. | 324/756.01 |
| 2012/0016495 A1 * | 1/2012 | Zondler et al. | 700/12 |

* cited by examiner

*Primary Examiner* — Son Le
(74) *Attorney, Agent, or Firm* — Haynes and Boone, LLP (57) ABSTRACT

A system and a method for testing information handling systems is provided. The system includes a top cover having a memory circuit and a bottom platform for receiving a test printed circuit board assembly (PCBA) including a slot. The system includes a sensor determining the relative position of the memory circuit and the slot; and a host controller coupled to the test PCBA and the sensor through a port. A computer program product including a non-transitory computer readable medium having computer readable and executable code is also provided. The code instructs a processor in a host controller in a test fixture to load a memory circuit on a crane; engage a sub-module carrying the memory circuit; load a printed circuit board assembly (PCBA); place a memory device on a slot in the PCBA; perform a system test on the PCBA; disengage the sub-module and the test fixture.

20 Claims, 8 Drawing Sheets

SYSTEM AND METHODS FOR MEMORY INSTALLATION IN FUNCTIONAL TEST FIXTURE

BACKGROUND

1. Technical Field

The present disclosure is related to the field of test fixtures for circuits and boards in electronic manufacturing. More specifically, the present disclosure is related to memory installation in test fixtures for circuits and boards in electronic manufacturing.

2. Description of Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use similar to financial transaction processing, airline reservations, enterprise data storage, or global communications. In addition, information handling systems may include a variety of hardware and software components that may be configured to process, store, and communicate information and may include one or more computer systems, data storage systems, and networking systems.

Test fixtures for circuits and boards in electronic manufacturing typically use memory circuits inserted into slots provided by the circuits and boards under test. Memory circuits provided to a test fixture supply the memory needed by the circuit and board to perform test operations scheduled by the test fixture. In a manufacturing environment, hundreds and even thousands of boards and circuits are tested, as described above, in a few hours. Typically, the process of placing the memory circuits in the test bed is performed by hand.

Hand installation of the memory circuits in a test fixture has several drawbacks. First, the procedure is physically exhaustive and painful for the operator. Second, and as a result of the first reason, manual installation of the memory in a test fixture increases the propensity for error in the process. Third, and related to the first two reasons, the number of false errors in the test procedure increases when memory installation is manual. Indeed, operator exhaustion increases the likelihood of errors in placing the memory circuit into the slot. Thus, a circuit or board under test may fail a test simply because the memory circuit is not properly inserted in the slot. Thus, there is an increased cost in product turnover when a circuit needs to be tested more than once to correct a bad memory connectivity issue at the point of test. In addition, the continuous handling of memory circuits used for testing and the stress on the slot connectors or 'sinks' in the circuit board result in accelerated degradation of the memory circuits. Thus, memory circuits need to be continuously checked and replaced in state-of-the-art testing platforms. Also, there is the potential to damage the circuit board under test. In particular, manual handling of memory circuits may damage delicate components in the slot sinks.

What is needed is a system and a method for memory installation in a functional test fixture that avoids test errors while preserving the circuit board components and reduces the cost of testing. What is also needed is a system and a method that provides a fast and reliable test platform for printed circuit boards (PCBAs) in information handling systems.

SUMMARY

According to some embodiments, a system for testing a plurality of information handling systems may include a top cover having a memory circuit; a bottom platform for receiving a test printed circuit board assembly (PCBA), the test PCBA including a slot; a sensor to determine the relative position of the memory circuit and the slot in the test PCBA; and a host controller coupled to the test PCBA and the sensor through a host controller port.

According to some embodiments, a computer program product may include a non-transitory computer readable medium having computer readable and executable code for instructing a processor in a host controller included in a test fixture having a plurality of information handling systems to perform a method, the method including loading a memory circuit on a crane in the test fixture; engaging a sub-module in the test fixture, the sub-module carrying the memory circuit; loading a printed circuit board assembly (PCBA) on the test fixture; placing a memory device on a slot in the PCBA; performing a system test on the PCBA; disengaging the sub-module; and disengaging the test fixture.

According to some embodiments, a method for testing information handling systems including printed circuit board assemblies (PCBAs) may include loading a memory circuit on a crane in the test fixture; engaging a sub-module in the test fixture, the sub-module carrying the memory circuit; loading a printed circuit board assembly (PCBA) on the test fixture; placing a memory device on a slot in the PCBA; performing a system test on the PCBA; disengaging the sub-module; and disengaging the test fixture.

These and other embodiments of the present disclosure will be described in further detail below with reference to the following drawings.

BRIEF DESCRIPTION OF THE DRAWINGS

In the figures, elements having the same reference number have the same or similar functions.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources similar to a central processing unit (CPU) or hardware or software control logic, ROM, and/or other types of nonvolatile memory. Additional components of the information handling system may include one or more disk drives, one or more network ports for communicating with external devices similar to various input and output (IO) devices, similar to a keyboard, a mouse, and a video display. The information handling system may also include one or more buses operable to transmit communications between the various hardware components.

In the manufacturing of information handling systems such as desktops, laptops, workstations, and Server platforms, a printed circuit board assembly (PCBA) is tested prior to assembly of the final system. In a typical test bed for a PCBA, memory circuits are installed manually. Memory circuits typically used in PCBAs may be dual in-line memory modules (DIMMs). Embodiments disclosed herein include a system and methods for handling the memory circuits in test fixtures automatically. Thus, embodiments as disclosed herein prevent damaging the slots of DIMMs by inserting accurately and reproducibly the memory circuits into the device slots. The PCBA test is thus more reliable as the proper mounting of the DIMMS secure effective electric coupling for the leads in the memory. Furthermore, use of an automatic and reproducible mechanism for memory insertion into a test fixture reduces the test time, increasing device throughput for the test fixture.

According to some embodiments, a system for automatically inserting a memory circuit into a test fixture may be an Intelligent Floating Memory Installation Module (IFMIM). An IFMIM as disclosed herein facilitates PCBA test efficiency by using a plurality of sensors and a floating mechanism to accurately and reproducibly insert the memory circuits in the test fixture.

Figure 1:
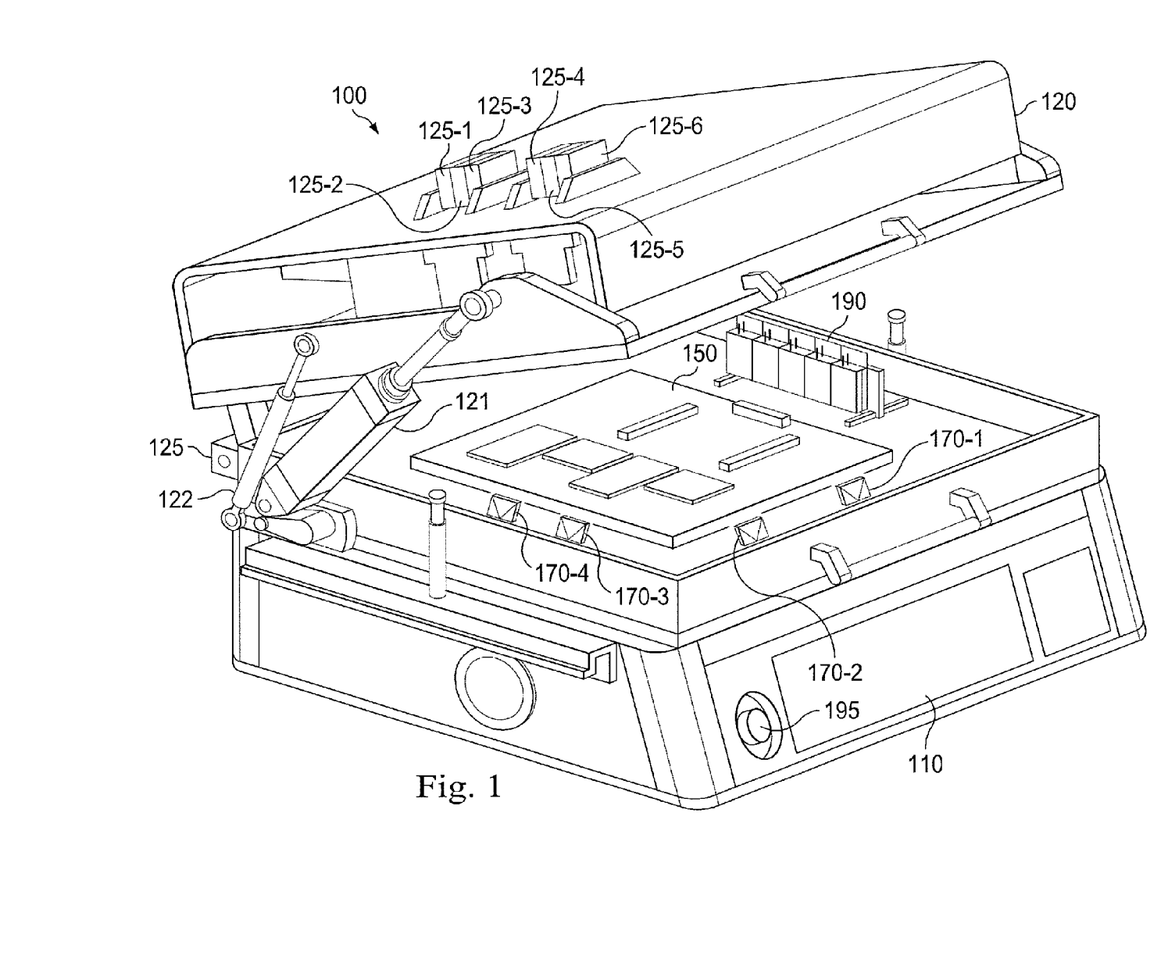
FIG. 1 shows a test fixture according to some embodiments.

FIG. 1 shows a test fixture 100 for testing a printed circuit board assembly (PCBA), according to some embodiments. Test fixture 100 includes a bottom platform 110 and a top cover 120. Top cover 120 closes on bottom platform 110 by pivoting about hinge 125. The pivoting motion is provided by arm 121. In some embodiments, arm 121 includes a pneumatically powered cylinder. Support for the pivoting motion may be reinforced by arm 122. A circuit board to be tested 150 is placed on a top surface of bottom platform 110. Circuit board 150 may be a PCBA for a motherboard of a computer device, such as a laptop, a desktop, a workstation or a Server platform. According to some embodiments, test fixture 100 may include a plurality of sensors 170-1, 170-2, 170-3, 170-4 (collectively referred to hereinafter as sensors 170). For example, sensors 170 may be placed on the top surface of bottom platform 110, as illustrated in FIG. 1. Sensors 170 may also be positioned in the interior portion of top cover 120. Sensors 170 may include optically based sensors having lasers, detectors, and cameras to accurately determine the position of a memory circuit being inserted into circuit 150.

FIG. 1 illustrates holders 125-1, 125-2, 125-3, 125-4, 125-5, and 125-6 (collectively referred hereinafter as holders 125). Holders 125 hold the memory circuits that will be used in the test for PCBA 150. Thus, when a test is ready to be performed, top cover 120 is lifted above bottom platform 110 and test PCBA 150 is placed on the top surface of bottom platform 110. The memory chips held by holders 125 are inserted onto PCBA 150 by closing top cover 120 over bottom platform 110. Top cover 120 is closed over bottom platform 110 by actuating arm 121.

Test fixture 100 in FIG. 1 may be an IFMIM operating automatically during the board test. In some embodiments an IFMIM avoids memory damage and damage to circuit 150 during the test by using sensors 170 and a floating mechanism in holders 125. According to some embodiments, IFMIM 100 ensures that each individual memory circuit obtains full electronic coupling with the memory slots during memory insertion, ensuring test stability. A host controller port 190 provides a signal to power up actuating arm 121 from a host control circuit. Sensors 170 provide data to host controller through port 190. In some embodiments, data provided by sensors 170 through port 190 includes information regarding the status of the memory module (e.g., engage or dis-engage).

FIG. 1 also illustrates a stop button 195, which may be pressed manually by a user to disengage test fixture 100 in case of an error or emergency. Upon activation of stop button 195, some embodiments disengage test fixture 100 thoroughly, and moving components are stopped in their current positions. Accordingly, in some embodiments a controller circuit may be used to handle an error or an emergency stop for test fixture 100.

Figure 2:
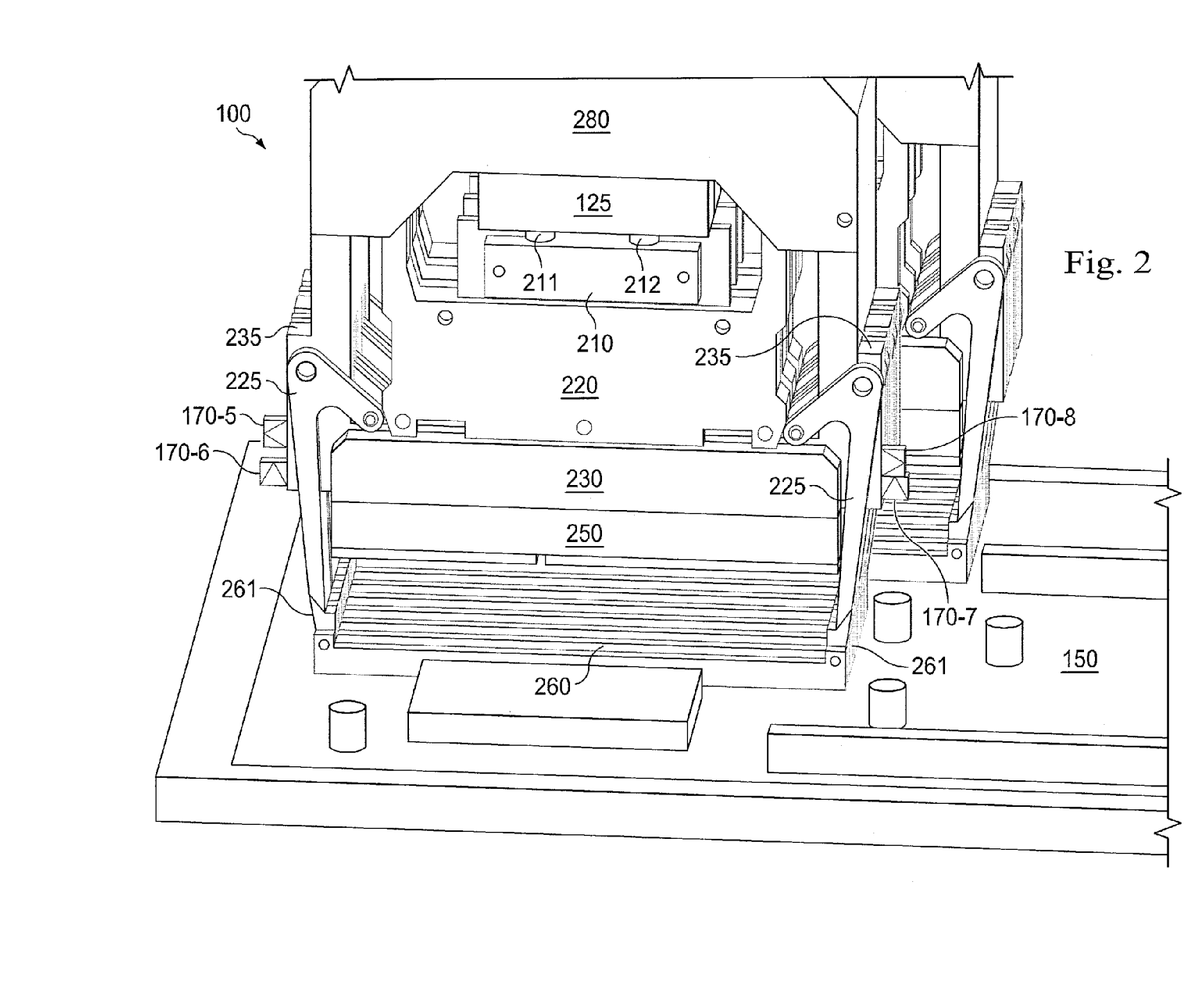
FIG. 2 shows a partial view of a test fixture, according to some embodiments.

FIG. 2 shows a partial view of test fixture 100, according to some embodiments. A crane 280 carries holders 125. Crane 280 may be mounted on a frame included in top cover 120. While FIG. 2 shows only one holder 125, more holders are partially hidden behind the first holder in the figure (cf. FIG. 1). Holder 125 includes a piston 210 that pushes on to a bracket 220. Bracket 220 holds a cartridge 230, which carries at least one memory circuit 250. Bracket 220 has movable arms 225 that protrude to the sides of bracket 220 beyond the reach of memory circuit 250. Arms 225 have a shape and a material that enables them to open and close secure lockers 261 in a slot 260 of test board 150. For example, in some embodiments arms 225 are designed such that as bracket 220 moves down towards slot 260, arm 225 pushes aside secure locker 261 and opens the slot. Thus, memory circuit 250 may be inserted onto slot 260, secure locker 261 is closed by arm 225, and the test on circuit 150 is ready to start.

In some embodiments, two secure lockers 261 may be used for each slot 260, so that the memory circuit is evenly placed inside the slot. Without loss of generality, each of the two slot lockers 261 in a slot 260 may be referred to as 'left' and 'right' slot locker, regardless of the actual orientation of slot 260 in test fixture 100.

In some embodiments, crane 280 may also include sensors 170-5, 170-6, 170-7, and 170-8 to further provide information about the position of memory circuit 250 relative to the position of slots 260. As in the case of sensors 170-1 through 170-4, sensors 170-5 through 170-8 may provide imaging data to a host controller through host controller port 190.

According to some embodiments, arm 225 may be movable in order to move secure locker 261 about a point of contact with bracket 220. Motion of arm 225 may be provided by lever 235, attached to crane 280. As lever 235 moves up and down (cf. FIG. 2), it provides a swinging motion to arm 225, which in turn opens and/or closes secure locker 261. Cartridge 230 firmly holds memory circuit 250 without deforming or damaging the printed circuit board (PCB) substrate of memory circuit 250.

In some embodiments, crane 280 may carry a plurality of sub-modules, where each sub-module includes a holder 125, a piston 210, a bracket 220, and a cartridge 230, as described in detail above. Accordingly, a single memory circuit 250 or a pair of memory circuits 250a, and 250b (not shown in FIG. 2) may be held on an individual sub-module. In some embodiments, piston 210 includes pneumatic cylinders 211 and 212, providing motion to the piston head. Cylinders 211 and 212 may be actuated via a pneumatic force, or via an electrical force, or a magneto-motive force. The specific mechanism used to move cylinders 211 and 212 is not limiting of the embodiments disclosed herein. The piston moves bracket 220 and cartridge 230 into a position to insert memory circuit 250 onto slot 260.

The size and shape of each sub-module may be adapted for use on different types of PCBAs (e.g. Workstation, Server). Furthermore, in some embodiments crane 280 may carry separate sets of sub-modules having different sizes. For example, a certain PCBA corresponding to a mother board 150 may include memory slots for different sizes of DIMMs. In such embodiments, crane 280 may include a first set of sub-modules adapted to carry a first type of DIMMs and a second set of sub-modules adapted to carry a second type of DIMMs.

Figure 3:
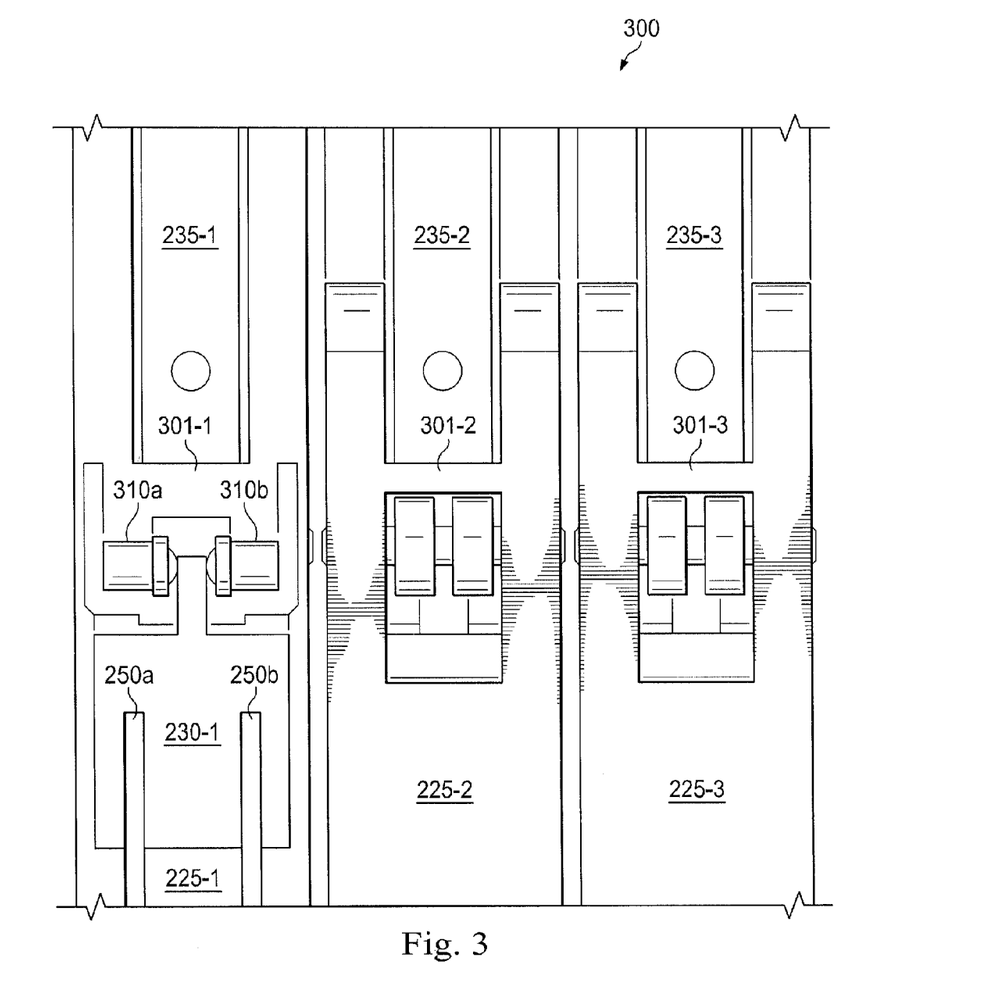
FIG. 3 shows a partial view of a memory mount in a test fixture, according to some embodiments.

FIG. 3 shows a partial view of a memory mount 300 in test fixture 100, according to some embodiments. Memory mount 300 may include sub-modules 301-1, 301-2, and 301-3 (collectively referred hereinafter as sub-modules 301). In some embodiments, memory mount 300 may be included inside crane 280, described in detail above (cf. FIG. 2). Sub-modules 301 include levers 235-1, 235-2, and 235-3 (collectively referred hereinafter as levers 235), arms 225-1, 225-2, and 225-3 (collectively referred hereinafter as arms 225), and cartridge 230-1 (other cartridges 230 not shown). Cartridges 230 hold memory circuits 250, as described in detail above in reference to FIG. 2. For example, cartridge 230-1 holds memory circuits 250a and 250b. To securely hold memory circuits 250a and 250b, in some embodiments cartridge 230 includes pin cylinders 310a, and 310b that are able to mount memory circuits 250a, and 250b respectively, in a floating configuration. Pin cylinders 310a and 310b are collectively referred hereinafter as pin cylinders 310.

According to some embodiments, a floating configuration for holding memory circuits 250a and 250b enables small adjustments in the positioning of the circuits as cartridge 230 is moved down by piston 210, placing memory circuits 250a and 250b close to slots 260. Thus, circuits 250a and 250b may self-align into position as they are inserted into slots 260, according to some embodiments. Use of pin cylinders 310 allows for a small misalignment between sub-modules 301 and slots 260, providing for precise positioning of the memory circuits onto the slots.

Figure 4:
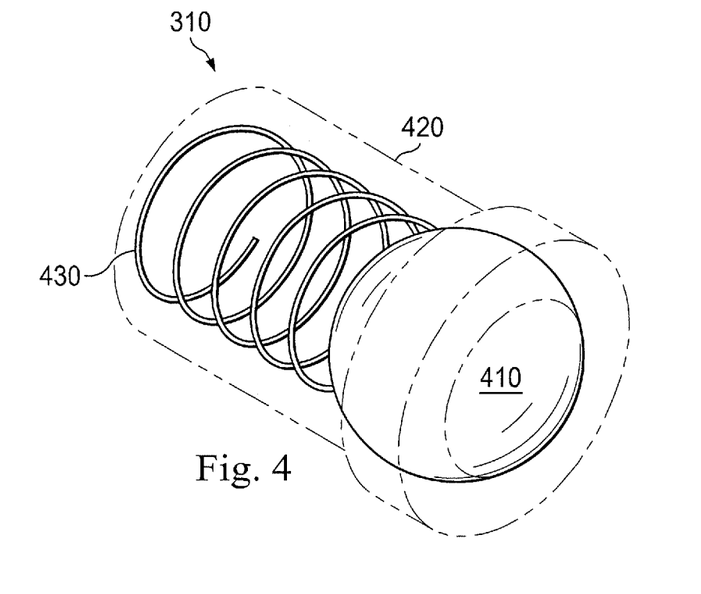
FIG. 4 shows a pin cylinder in a memory mount for a test fixture, according to some embodiments.

FIG. 4 shows pin cylinder 310 in a memory mount for a test fixture, according to some embodiments. Pin cylinder 310 includes a ball 410 and a spring 430 inside a casing 420. When the ball 410 is coupled to a memory circuit, spring 430 allows the ball to move slightly while still exerting pressure on the memory circuit.

Figure 5:
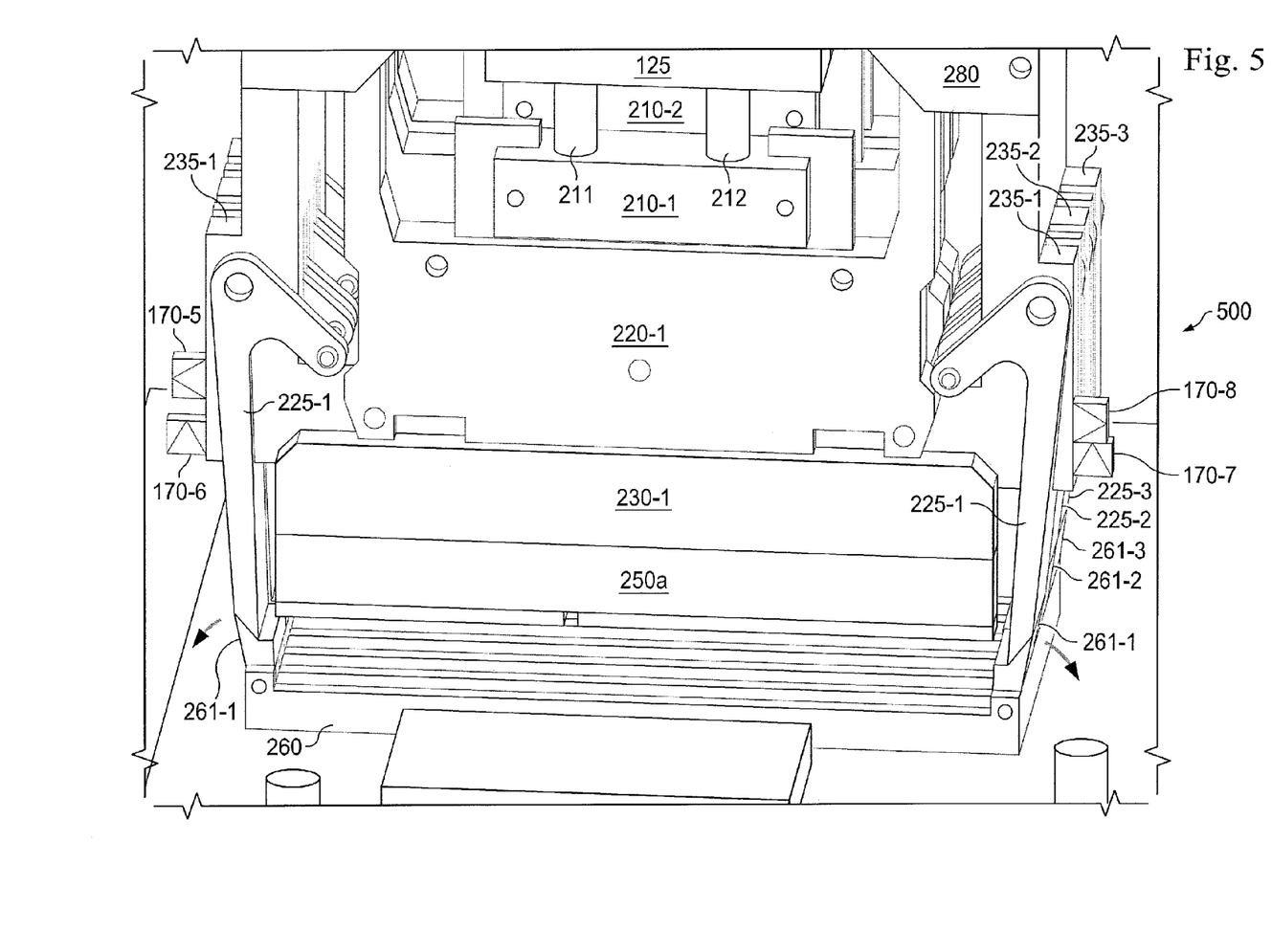
FIG. 5 shows a configuration for inserting a memory circuit in a circuit board for a test fixture, according to some embodiments.

FIG. 5 shows a configuration 500 for inserting memory circuit 250a in a circuit board for a test fixture, according to some embodiments. Elements 170, 210, 211, 212, 220, 230, 235, 250, and 261 in FIG. 5 are as described in detail above in relation to FIG. 2. Configuration 500 shows cylinders 211 and 212 moving piston 210-1 down, so that memory circuit 250a approaches slots 260. Also depicted in FIG. 5 is a swing motion of arms 225-1 laterally, as illustrated by the thick, black arrows. In configuration 500, arms 225-1 open up locker 261-1 for slot 260, opening the slot for insertion of memory circuit 250a.

Figure 6:
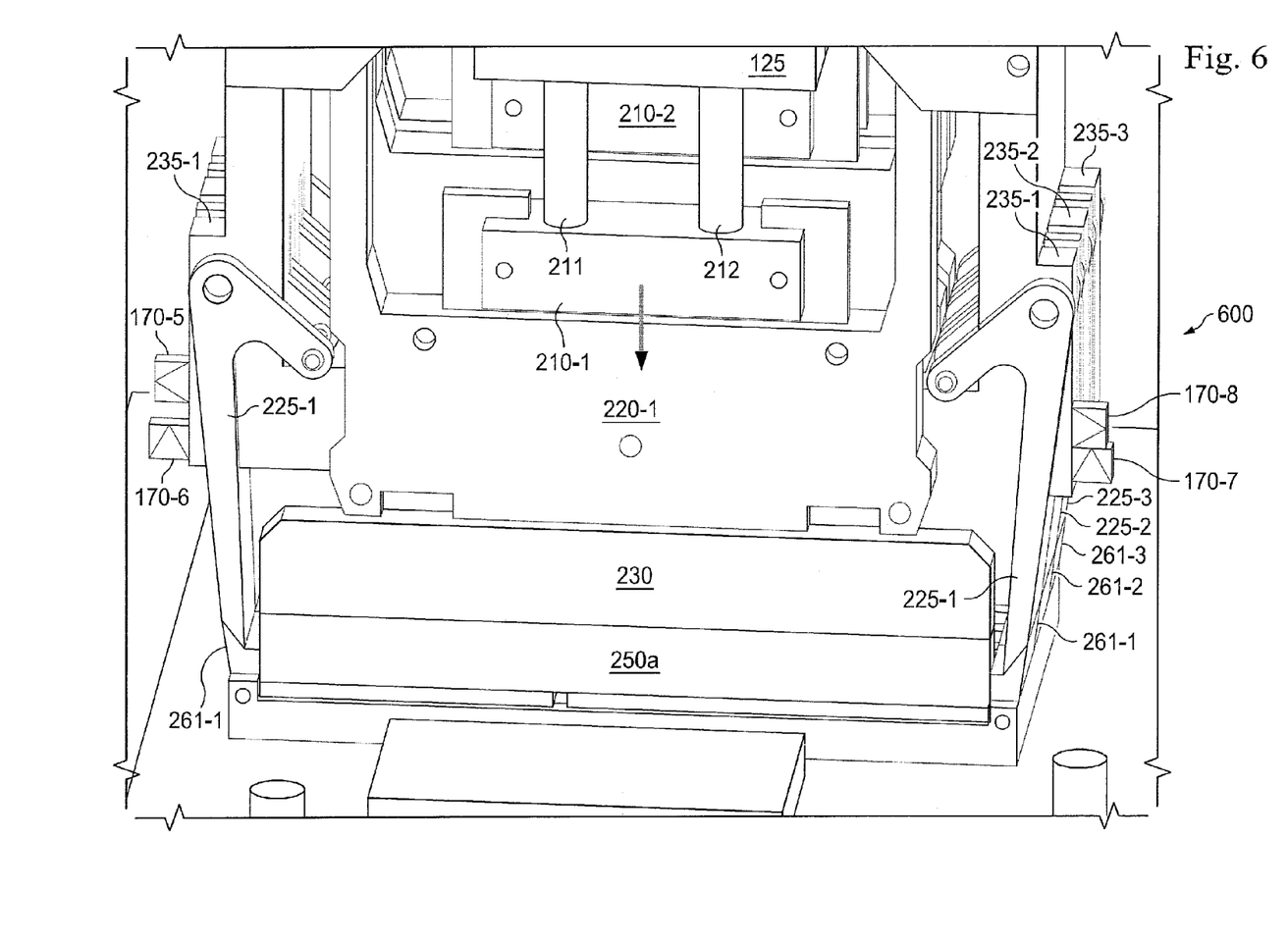
FIG. 6 shows a configuration for inserting a memory circuit in a circuit board for a test fixture, according to some embodiments.

FIG. 6 shows a configuration 600 for inserting memory circuit 250a in a circuit board for a test fixture, according to some embodiments. Elements 170, 210, 211, 212, 220, 230, 235, 250, and 261 in FIG. 6 are as described in detail above in relation to FIGS. 2 and 5. According to configuration 600, bracket 220, cartridge 230, and memory circuit 250 may fall into a slot 260. During the fall, piston 210 may passively allow floating mechanism 310 to appropriately adjust circuit 250 in place (cf. FIG. 3). For example: if memory circuit 250 contacts the right side of slot 260, left ball 310a will be pressed and circuit board 250 will be rebounded to the left side of slot 260 (cf. FIGS. 3 and 4).

Once the free fall of circuit 250 into slot 260 stops and sensors 170 determine that the positioning of circuit 250a is appropriate, configuration 600 shows cylinders 211 and 212 moving piston 210-1 further down, according to the black arrow. FIG. 6 illustrates arms 225-1 adjusting lockers 261-1 into a lock position. Accordingly, memory circuit 250a is properly coupled to PCBA 150 through a slot in slots 260.

Figure 7:
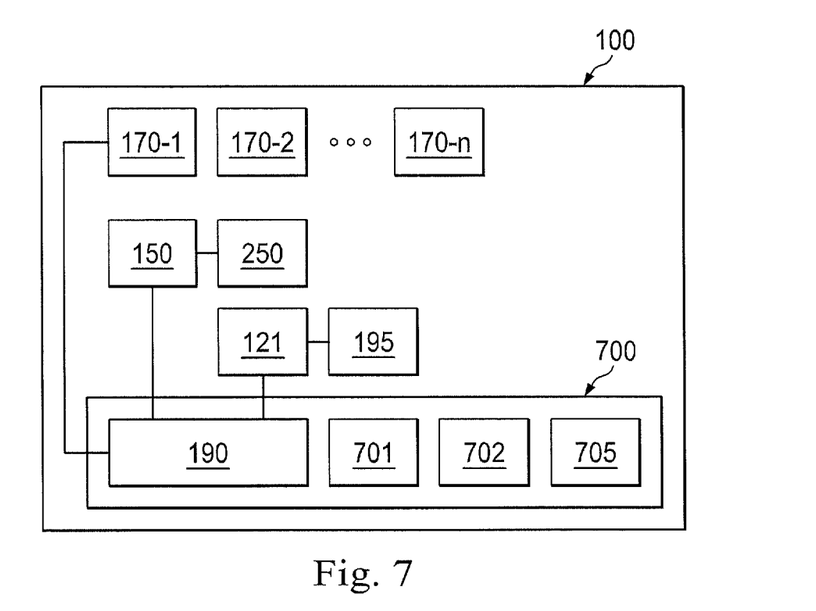
FIG. 7 shows a block diagram of a test fixture, according to some embodiments.

FIG. 7 shows a block diagram of test fixture 100, according to some embodiments. FIG. 7 illustrates a plurality of sensors 170-1 through 170-n, where 'n' is an integer. The specific value of 'n' is not limiting of embodiments disclosed herein; for example, in embodiments above, a number 'n' of up to 8 sensors is shown (cf. FIGS. 1 and 2). Some embodiments of test fixture 100 may include a larger number of sensors, such as 20, 30, or even more. Fixture 100 also shows a block for test board 150 and memory circuit 250. According to some embodiments, memory circuit 250 may already be coupled to test board 150, for example as in configuration 600 described in detail above (cf. FIG. 6). FIG. 7 also shows arm 121 and stop button 195. According to FIG. 7, test board 150, arm 121, and stop button 195 are coupled to a host controller 700 through host controller port 190, described in detail above (cf. FIG. 1). Host controller 700 includes a processor circuit 701 and a memory circuit 702. Host controller 700 performs control operations in fixture 100 for testing circuit board 150. Host controller 700 then provides a user interface 705 with relevant data related to the results of the test.

Test fixture 100 may include the capability to provide feedback to host controller 700 regarding an operational failure. Thus, host controller 700 may provide test fixture 100 an appropriate command to handle the operational failure. In some embodiments, controller 700 may provide a stop command to test fixture 100, or an emergency command such as 'stop' and 'open' top cover 120. In some embodiments, when stop button 195 fails and the test fixture 100 also fails to provide a failure feedback to controller 700, top cover 120 may be manually opened by an operator so that memory DIMM can be uninstalled from crane 280 or a slot 260. In such scenario. Test fixture 100 may be configured to disengage power as soon as an operator gets a hold of a handle in top cover 120.

The test operations of fixture 100 may be the result of processor circuit 701 executing commands using data stored in memory circuit 702. The data used by processor circuit 701 may include data provided to memory 702 by sensors 170-1 through 170-n, through host controller port 190. In some embodiments, test operations of fixture 100 may include error conditions which, when satisfied, prompt host controller 700 to issue a stop command to disengage fixture 100 through stop button 195. The test operations of fixture 100 may include the steps in methods 800 and 900, described in detail with reference to FIGS. 8 and 9, below.

Figure 8:
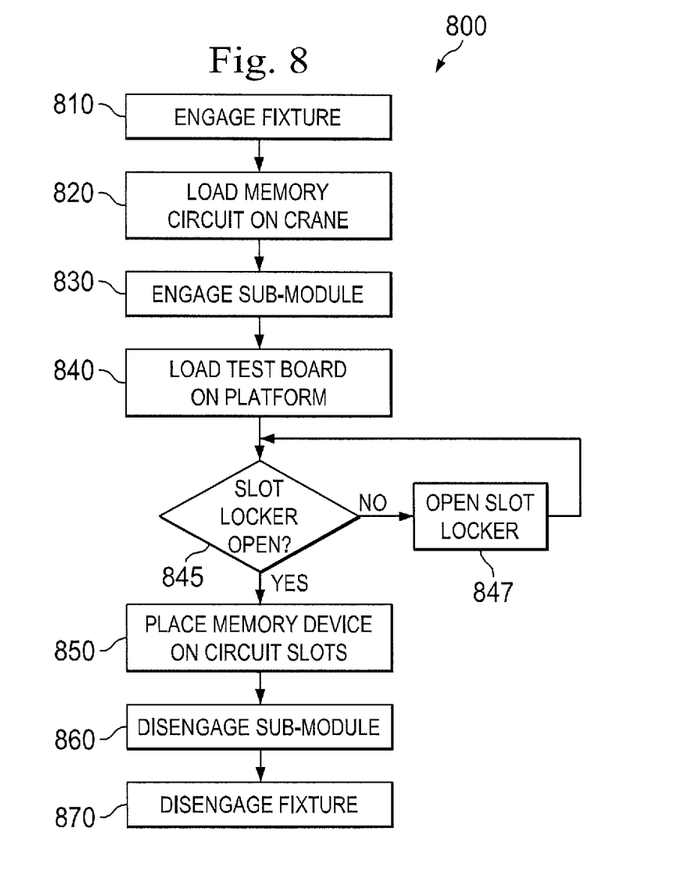
FIG. 8 shows a flow chart for a method to install a memory circuit in a printed circuit board assembly (PCBA) in a test fixture, according to some embodiments.

FIG. 8 shows a flow chart for a method 800 to install a memory circuit in a PCBA in a test fixture, according to some embodiments. In some embodiments, method 800 is performed by a test fixture such as test fixture 100, using memory circuit 250 to test circuit board 150. Furthermore, steps in method 800 may be performed at least partially by test fixture 100 under control of host controller 700 having processor circuit 701 executing commands provided by memory circuit 702.

In step 810 the test fixture is engaged, or powered 'on.' In step 820, memory circuits are loaded into a crane of the test fixture. A crane of the test fixture may be as crane 280 in fixture 100, described in detail above (cf. FIG. 2). In some embodiments, step 820 may not be necessary, as memory circuits may already be loaded into the crane.

In step 830, a sub-module of the test fixture is engaged. The sub-module may be as any of sub-modules 301-1, 301-2, and 301-3, described in detail above (cf. FIG. 3). In step 840 a test board is loaded on a platform of the test fixture. In steps 845 and 847, the sub-module ensures that the 'left' and 'right' slot lockers in the slot allocated to the memory circuit is in an 'open' position. Accordingly, step 845 may be performed by sub-module 301-1 using sensors 170 placed on crane 280 (cf. FIGS. 2 and 3).

In step 850 a memory device is placed in the circuit slots. To achieve this, in some embodiments step 850 includes moving the crane carrying the sub-module over the test board to find the proper slot. During the moving process, a piston such as piston 210 (cf. FIG. 2) may be disengaged. The speed of the sub-module in step 850 may be controlled by the host controller according to timing constraints, ensuring no damage is made to the memory circuit or to the test board. For example, the speed of motion of the sub-assembly in step 850 may be controlled by using feedback provided by the sensors located in the crane and in a bottom platform of the test fixture. Step 850 may include using sensors such as sensors 170 to ensure that the edge of the memory circuit is able to slide into the slot in the proper direction, without damaging the memory circuit. In some embodiments, step 850 includes moving the memory circuit until the sensors detect alignment with the slot edge. Thus, in some embodiments step 850 includes allowing bracket 220, cartridge 230, and memory circuit 250 to fall into slot 260 by gravity. As bracket 220, cartridge 230, and memory circuit 250 fall into slot 260, floating mechanism 310 corrects any misalignment between circuit 250 and slot 260.

Step 850 may include engaging piston 210 to move the memory circuit towards the slot. Step 850 may also include moving a lever in crane 280, such as lever 235. The lever actuates on an arm in the sub-module, such as arm 225. The arm in the sub-module presses on the slot locker, which is in an open position, so as to push the memory circuit into the slot with some floating room. Once the memory circuit is securely in place, as detected by the sensors in the crane and in a bottom platform of the test fixture (cf. FIGS. 1 and 2) the pressure on the slot locker may be removed. Accordingly, in some embodiments step 850 provides a force to move the memory circuit into the slot through the slot lockers. Thus, while the memory circuit is lightly moved down by the piston, the final push for the memory circuit to fit into the slot is provided by the slot lockers, through actuation of the arms in the sub-module.

In step 860 the sub-module is disengaged. Step 860 may include removing the memory circuit from the slot in the test board. Accordingly, step 860 may include using the arms in the sub-module to push the slot locker into an open position. As the slot locker opens up, for example by pivoting to a side of the memory circuit, the slot locker pushes the memory circuit out of an engaging position with the test board. Thus, the sub-module applies a light and gentle force on the slot locker and it is the slot locker that disengages the memory circuit. When the memory circuit fully leaves the slot, the sub-module pulls the memory circuit clear out of the test board using the piston, a bracket and a cartridge (e.g., bracket 220 and cartridge 230, FIG. 2). Accordingly, upon request by a user or by a program command stored in the memory circuit of the host controller, steps 830 through 860 may be performed repeatedly.

In step 870 the fixture is disengaged when the procedure is completed. In some embodiments, step 870 may be performed at any time during execution of method 800. For example, when an error is encountered during module operation, a protection mechanism may include performing step 870 to ensure the module can be fully released without damage. Activation of step 870 may be prompted at any time during method 800 by a user pushing a 'stop' button such as button 195 (cf. FIG. 1).

Figure 9:
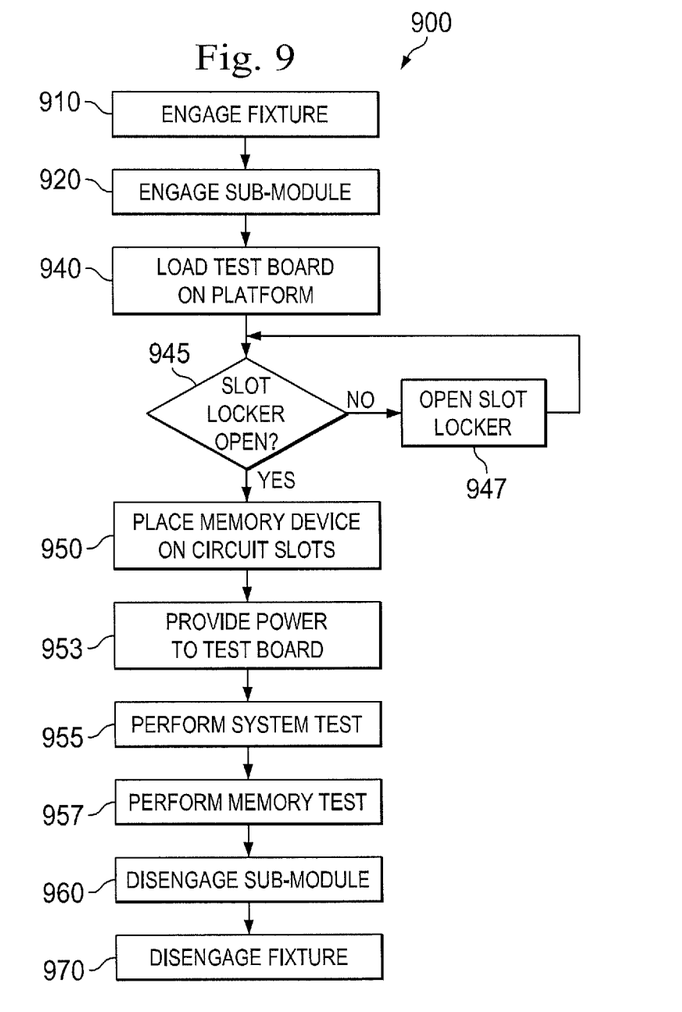
FIG. 9 shows a flow chart for a method to test a printed circuit board assembly (PCBA) in a test fixture, according to some embodiments.

FIG. 9 shows a flow chart for a method 900 to test a PCBA in a test fixture, according to some embodiments. In some embodiments, method 900 is performed by a test fixture such as test fixture 100, using memory circuit 250 to test circuit board 150. Furthermore, steps in method 900 may be performed at least partially by test fixture 100 under control of host controller 700 having processor circuit 701 executing commands provided by memory circuit 702.

Steps 910, 920, 940, 950, 960, and 970 in method 900 may be as steps 810, 820, 840, 850, 860, and 870, respectively, in method 800, described in detail above (cf. FIG. 8). In step 953, power is provided to the test board loaded on the platform in step 940. In step 955 a system test is performed on the circuit board. According to some embodiments, the test in step 955 may be a power-on-self (POS) test. In step 957 a memory test is performed. According to some embodiments, a host controller may perform step 957 while the memory circuit is still inserted onto the test board, as a checkup to ensure that the memory circuit has not been damaged. Thus, according to some embodiments, once the test board has passed the tests in step 953, the host controller may use the test board to ensure that the memory circuit is in good condition. When the memory circuit passes the test in step 957, the host controller may continue to use the same memory chip for further tests, as in step 953. When the memory circuit fails the test in step 957, the host controller may provide an alert to the user through a user interface, such as interface 705 (cf. FIG. 7). The alert may include a request to replace the failed memory circuit from the specific sub-module being used in method 900.

Embodiments described above are exemplary only. One skilled in the art may recognize various alternative embodiments from those specifically disclosed. Those alternative embodiments are also intended to be within the scope of this disclosure. As similar to such, the invention is limited only by the following claims.

What is claimed is:

1. A system for testing a plurality of information handling systems, the system comprising:

a top cover;

a bottom platform for receiving a test printed circuit board assembly (PCBA), the test PCBA comprising a slot having a slot locker;

a crane mounted to the top cover, wherein the crane comprises a cartridge to hold a memory circuit, movable arms, and one or more levers to provide a swinging motion to the movable arms in order to lock and unlock the slot locker;

a sensor to determine the relative position of the memory circuit and the slot in the test PCBA; and a host controller coupled to the test PCBA and the sensor through a host controller port.

2. The system of claim 1 wherein the crane further comprises a piston to move the memory circuit.

3. The system of claim 1 wherein the crane is included in one of a plurality of sub-modules, each sub-module adapted to fit a slot in the test PCBA.

4. The system of claim 1 wherein the movable arms are configured to push the slot locker into an unlock position before the piston moves the memory circuit into the slot and into a lock position after the piston moves the memory circuit into the slot.

5. The system of claim 1 further comprising a pin cylinder coupled between the cartridge and the top cover for holding the memory circuit in a floating configuration, wherein the floating configuration provides a mechanism for self-aligning the memory circuit with the slot.

6. The system of claim 5 wherein the pin cylinder comprises a ball coupled to a spring; and a casing to hold the spring; wherein the spring provides a pressure to the ball against the memory circuit.

7. A computer program product comprising a non-transitory computer readable medium having computer readable and executable code for instructing a processor in a host controller included in a test fixture having a plurality of information handling systems to perform a method, the method comprising:

loading a memory device on a crane in the test fixture, the crane being mounted to a top cover of the test fixture;

engaging a sub-module in the test fixture, the sub-module carrying the memory device;

placing the memory device on a slot in a printed circuit board assembly (PCBA) on the test fixture, the slot having a slot locker, and the memory device being held using a floating mechanism for self-aligning the memory device with the slot;

performing a system test on the PCBA;

disengaging the sub-module; and disengaging the test fixture;

wherein the crane includes movable arms and one or more levers to provide a swinging motion to the movable arms in order to open and close the slot locker.

8. The computer program of claim 7, wherein placing the memory device on the slot in the PCBA comprises:

opening the slot locker with the movable arms as a cylinder pushes the memory device down;

allowing the memory device to fall onto the slot; and pushing the memory device onto the slot by the cylinder until the slot locker is closed by the movable arms.

9. The computer program of claim 8 wherein allowing the memory device to fall onto the slot includes self-aligning the memory device with the slot using the floating mechanism.

10. The computer program of claim 9 wherein the floating mechanism comprises a pin cylinder to hold the memory device to a cartridge in the sub-module of the test fixture.

11. The computer program of claim 7, wherein the performing a system test on the PCBA comprises:

providing power to the PCBA;

performing a power on self (POS) test; and performing a memory test when the POS test passes.

12. The computer program of claim 7, wherein the method further comprises adjusting the position of the memory circuit relative to the slot in the PCBA using data provided by a sensor.

13. A method for testing information handling systems including printed circuit board assemblies (PCBAs), the method comprising:

loading a memory circuit on a crane in the test fixture, the crane being mounted to a top cover of the test fixture;

engaging a sub-module in the test fixture, the sub-module carrying the memory circuit;

loading a printed circuit board assembly (PCBA) on the test fixture;

placing a memory device on a slot in the PCBA, the slot having a slot locker, and the memory device being held using a floating mechanism for self-aligning the memory device with the slot;

performing a system test on the PCBA;

disengaging the sub-module; and disengaging the test fixture;

wherein the crane includes movable arms and one or more levers to provide a swinging motion to the movable arms in order to open and close the slot locker.

14. The method of claim 13, wherein the performing a system test on the PCBA comprises providing power to the PCBA;

performing a power on self (POS) test; and performing a memory test when the POS test passes.

15. The method of claim 13, wherein placing the memory device on the slot in the PCBA comprises:

opening the slot locker with the movable arms as a cylinder pushes the memory device down;

allowing the memory device to fall onto the slot; and pushing the memory device onto the slot by the cylinder until the slot locker is closed by the movable arms.

16. The method of claim 13 wherein allowing the memory device to fall onto the slot includes aligning the memory device with the slot using the floating mechanism.

17. The method of claim 13 wherein the floating mechanism comprises a pin cylinder to hold the memory device to a cartridge in the sub-module of the test fixture.

18. The method of claim 13, wherein the placing the memory device on the slot in the PCBA comprises opening the slot locker.

19. The method of claim 13, further comprising adjusting the position of the memory circuit relative to the slot in the PCBA using data provided by a sensor.

20. The method of claim 18 further comprising:

detecting an operation failure using data provided by the sensor; and actuating an emergency stop when an operation failure is detected.

* * * * *